United States Patent [19]

Abita

[11] 3,986,876

[45] Oct. 19, 1976

[54] METHOD FOR MAKING A MASK HAVING A SLOPED RELIEF

[75] Inventor: Joseph L. Abita, Columbia, Md.

[73] Assignee: The United States of America as represented by the Secretary of the Navy, Washington, D.C.

[22] Filed: July 3, 1975

[21] Appl. No.: 593,148

Related U.S. Application Data

[63] Continuation of Ser. No. 473,107, May 24, 1974, abandoned.

[52] U.S. Cl. .................................. 96/38.3; 96/36; 96/36.2; 156/3; 156/8; 156/11; 355/75; 118/504

[51] Int. Cl.$^2$ ............... G03C 5/00; G03C 11/00; B29C 17/08

[58] Field of Search ............... 96/35, 36.2, 38.3, 36; 156/3, 8, 11, 13, 15, 17; 65/31; 355/75, 87, 91; 118/504

[56] References Cited

UNITED STATES PATENTS

| | | | |
|---|---|---|---|
| 1,922,434 | 8/1933 | Gundlach | 96/38.3 |
| 3,585,121 | 6/1971 | Franks et al. | 204/192 |
| 3,751,250 | 8/1973 | Moscony et al. | 96/38.3 |
| 3,824,014 | 7/1974 | Abita | 355/75 |

Primary Examiner—Edward C. Kimlin

[57] ABSTRACT

The invention provides a method for making a relief mask used for pattern generation in planar thin film overlays, which relief mask is structurally formed to produce intimate contact between a photoresist surface and a masking pattern during exposure of the photoresist surface. The present method comprises the steps of:

1. depositing gold on a blank mask substrate;
2. coating the gold-covered substrate with a photosensitive material;
3. forming a relief pedestal on the blank mask substrate by exposure of the photoresist and etching of the gold; and,
4. forming a masking pattern on the relief pedestal.

3 Claims, 5 Drawing Figures

METHOD FOR MAKING A MASK HAVING A SLOPED RELIEF

This is a continuation of application Ser. No. 473,107, filed May 24, 1974 now abandoned.

CROSS-REFERENCE TO RELATED APPLICATION

The present invention relates to the subject matter of U.S. Pat. application Ser. No. 383,023, filed July 26, 1973, now U.S. Pat. No. 3,824,014, by the same inventor.

BACKGROUND OF THE INVENTION

A. Field of the Invention

The invention relates to mask construction techniques employed in photographic fabrication of microminiature electronic devices, particularly those devices requiring the use of high resolution photolithographic techniques.

B. Description of the Prior Art

Pattern generation in planar thin film overlays is usually accomplished by reproducing the pattern (or its negative) in a photosensitive resist applied to the film's surface. In order to obtain accurate delineation of the pattern, positive contact between the pattern mask and the photoresist surface is essential. Build-ups of photoresist material often occur around the perimeter of a substrate and thereby prevent contact between the pattern mask and the surface of the photoresist. Thus, the precise masking ability of the mask apparatus is of great importance. In the prior art, methods for making precise mask apparatus range from chemical build-up of the mask to mechanical construction thereof. Chemically fabricated masks require a number of processing steps both in the application of the mask and in the removal thereof. Mechanical masks therefore present certain advantages, such as reduction of fabrication time, reuseability, etc. However, mechanical masks in high resolution work are susceptible to the aforementioned difficulties associated with excessive photoresist deposits around the perimeter of a substrate which prevent intimate contact between the masking pattern and the surface of the substrate. The present invention provides a method for fabricating a mechanical mask which avoids these contact problems, thereby rendering the use of mechanical masks more acceptable in high resolution photolithographic production of microelectronic devices. A particular advantage of the present method is that use of the present method improves yields in mask-to-resist pattern transfer without surface preparation.

SUMMARY OF THE INVENTION

Photolithographic techniques have long been used to produce circuit patterns in thin film overlays necessary for hybrid and semiconductor microelectronic package fabrication. A usual step in these processing techniques requires the application of photoresist material onto a substrate, the substrate subsequently being covered by a masking device so that a particular circuit pattern may be developed on the surface of the substrate. Excessive build-up of this photoresist material often prevents intimate contact between the masking device and the substrate surface, the masking devices usually comprising flat plate-like members which are blocked from full face-to-face contact with the surface of the photoresist by irregularly raised portions of photoresist disposed about the perimeter of the substrate. High resolution work requires that essentially no spatial separation exist between the masking device and the surface of the photoresist.

A relief mask such as is disclosed by me in U.S. Pat. application Ser. No. 383,023, filed July 26, 1973, now U.S. Pat. No. 3,824,014 eliminates this spatial separation problem by disposing a masking pattern on the planar surface of a raised mound, the mound extending from the surface of a flat backing plate and being reduced in size relative to the backing plate. The mound extends toward contact with the photoresist surface despite the presence of excessive deposits about the perimeter of the substrate. The present invention provides a method for making such a relief mask in a unitary fashion, i.e., the mask is fabricated as a single unit to avoid problems associated with a mask composed of two adjoined pieces. The present method essentially comprises deposition of gold on a blank mask substrate; coating the gold-covered substrate with photosensitive material such as photoresist; forming a relief mound or pedestal on the substrate; and forming a masking pattern on the pedestal.

It is therefore a primary object of the invention to provide a reliable and rapid method for making a unitary relief mask useful for high resolution fabrication of microelectronic devices.

Further objects and advantages of the invention will become apparent in light of the following description of the preferred embodiment of the invention.

DESCRIPTION OF THE PREFERRED EMBODIMENT

Photolithographic processing of substrates demands high yields to reduce turn-around time and expense. A particular factor influencing yield is the degree of contact between a mask and photoresist surface during exposure to a suitable exposure source used in exposing the photoresist. A high degree of spatial separation between the mask and the surface of the photoresist degrades line width and edge definition and allows exposing radiation to migrate in from masking element edges, thereby degrading circuit resolution. As disclosed by me in co-pending U.S. Pat. application Ser. No. 383,023, filed July 26, 1973, photoresist build-up on a substrate, which is produced by coating methods such as "whirling", requires the use of a relief mask to assure intimate contact between the masking pattern and the surface of the photoresist. While this edge build-up could be removed or reduced by grinding and polishing the substrate perimeter, such a procedure is impractical when dealing with a large number of substrates or with a number of different substrates. Thus, a relief mask composed of a secondary mask and a carrier such as is disclosed in my patent application identified above provides an effective solution. The masking pattern is placed on a raised surface of a dimension which falls within the border of the resist build-up.

Figure 1:
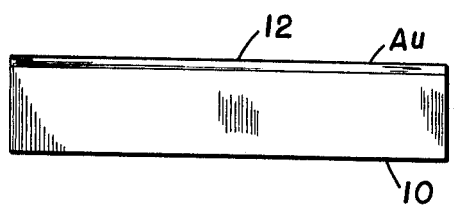
FIG. 1 is an elevational view of a substrate onto which a gold layer has been deposited.
Figure 2:
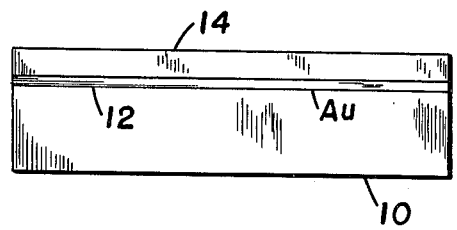
FIG. 2 is an elevational view of the assembly of FIG. 1 onto which a photosensitive layer has been deposited.

The present invention provides a method for making a mask of the type disclosed in my above-identified patent application. In particular, the present method produces a unitary mask which avoids problems associated with the use of two adjoined pieces. Referring to FIG. 1, a blank mask substrate 10 is shown to have a layer 12 of gold deposited thereon. The substrate 10 is preferably comprised of photoplate glass approximately 0.050 inch thick and is cleaned by ultrasonic agitation in a detergent solution followed by boiling distilled acetone rinses prior to deposition of gold thereon. The substrate 10 is placed in a vacuum deposition apparatus (not shown) for heat treatment and gold deposition thereon. Prior to deposition, the substrate 10 is vacuum heated to approximately 450° C and allowed to remain at this temperature for approximately 20 minutes. The vacuum conditions chosen may preferably be less than $5 \times 10^{-5}$ torr. The temperature is then lowered to 80° C and gold of 4N purity is deposited at 5A/sec to a thickness of 2000A to produce the layer 12. Upon removal from the vacuum system, the coated substrate 10 is placed in a dry nitrogen atmosphere at 100° C for 15 minutes. On removal from the nitrogen atmosphere, the substrate 10 is immediately coated with photopolymer dry film resist, such as is produced by Dynachem Corporation, to produce a photoresist layer 14 on the gold layer 12 as is shown in FIG. 2.

Figure 3:
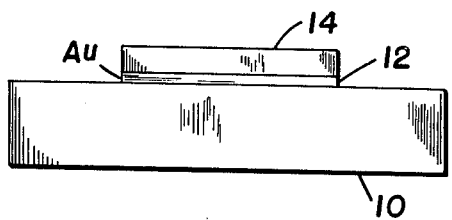
FIG. 3 is an elevational view of the assembly of FIG. 2 after an etching operation has been performed on the gold layer thereof.
Figure 4:
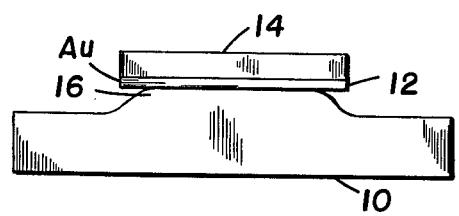
FIG. 4 is an elevational view of the assembly of FIG. 3 after an etching operation has been performed on the substrate; and, FIG. 5 is an elevational view of the relief mask having a masking pattern formed on the pedestal.

Masking techniques are then used to expose the photoresist layer 14 in order to define relief areas, the gold layer 12 being then etched after development of the exposed portions of the photoresist layer 14 to produce the structure shown in FIG. 3. The gold layer 12 is preferably etched with potassium iodide solution. The raised pedestal 16 on the substrate 10 is then produced by a 5 to 10 minute etch of those portions of the substrate 10 not now masked by the remaining portions of the gold layer 12 and photoresist layer 14. The substrate 10 is etched in a room temperature bath of $HF/H_2O$ solution. A predetermined pedestal height of about 0.08 mm thereby results, as shown in FIG. 4. The edges of the pedestal 16 are sloped due to the etching action immediately under the gold layer 12. The remaining portions of the gold layer 12 and photoresist layer 14 are removed in a flowing $H_2O$ rinse.

Figure 5:
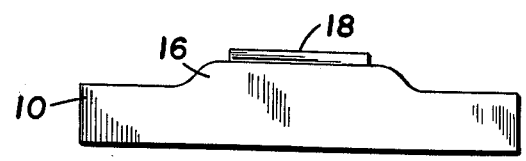

A masking pattern 18 is then formed on the planar surface of the raised pedestal 16 as shown in FIG. 5. The masking pattern 18 may be formed by etching of a metallic layer, by resist lift off, or by coating with photographic emulsion. These techniques are well-known and need not be described in detail herein. Since the final step of the present method requires coating with resist or emulsion to produce the masking pattern 18, it might be expected that a build-up of resist or emulsion might be expected on the relief plateau edges of the substrate 10. This expected build-up does not occur, however, due to the intentional use of a relatively inadherent metal, e.g., gold, as a masking aid during etch of the substrate 10. Additionally, no pit defects are evidenced on the pedestal 16 due to resist "pinholes." This advantage is also due to the marginal adherence and high mobility of gold which results in a continuous defect-free film.

Thus, the invention comprises a method especially suited to making a relief mask and consisting of the following steps:
1. depositing gold on a blank mask substrate;
2. coating the gold-covered substrate with a photosensitive material;
3. forming a relief pedestal on the blank mask substrate by exposure of the photoresist and etching of the gold; and,
4. forming a masking pattern on the relief pedestal.

Although the invention has been described by reference to a particular application, the concept is equally applicable to other applications wherein a unitary relief mask is to be fabricated.

What is claimed is:
1. A method for making a relief mask used for pattern generation in the fabrication of microelectronic devices, comprising the steps of:
   depositing a layer of gold on a planar surface of a blank mask substrate;
   removing predetermined portions of the gold layer to expose preselected portions of the surface of the substrate;
   etching the preselected portions of the surface of the substrate to form a raised pedestal extending from said surface thereof, the edges of the raised pedestal being sloped by the etching action immediately under the edges of the gold layer surmounting the raised pedestal;
   removing the remaining portions of the gold layer from the surface of the substrate; and,
   forming a masking pattern on the surface of the pedestal.
2. The method of claim 1 wherein the step of removing the remaining portions of the gold layer from the surface of the substrate comprises the step of:
   rinsing the gold layer from the substrate with water.
3. The method of claim 1 wherein the step of removing predetermined portions of the gold layer comprises the steps of:
   coating the gold layer with a layer of photoresist material;
   masking predetermined portions of the photoresist layer;
   exposing the unmasked portions of the photoresist layer to exposing radiation;
   developing the exposed portions of the photoresist layer to expose predetermined portions of the surface of the gold layer; and,
   etching said exposed predetermined portions of the surface of the gold layer to expose the preselected portions of the surface of the substrate.

* * * * *